US012702055B2

(12) United States Patent
Itoh

(10) Patent No.: US 12,702,055 B2
(45) Date of Patent: Aug. 4, 2026

(54) SEMICONDUCTOR MODULE WITH BENT EXTERNAL TERMINAL

(71) Applicant: FUJI ELECTRIC CO., LTD.,
Kawasaki (JP)

(72) Inventor: Taichi Itoh, Kawasaki (JP)

(73) Assignee: FUJI ELECTRIC CO., LTD.,
Kawasaki (JP)

( * ) Notice: Subject to any disclaimer, the term of this patent is extended or adjusted under 35 U.S.C. 154(b) by 764 days.

(21) Appl. No.: 17/830,186

(22) Filed: Jun. 1, 2022

(65) Prior Publication Data

US 2022/0301954 A1 Sep. 22, 2022

Related U.S. Application Data

(63) Continuation of application No. PCT/JP2021/016651, filed on Apr. 26, 2021.

(30) Foreign Application Priority Data

Jun. 16, 2020 (JP) ................................. 2020-103814

(51) Int. Cl.
H10W 76/12 (2026.01)
H10W 76/42 (2026.01)

(52) U.S. Cl.
CPC ........... H10W 76/12 (2026.01); H10W 76/42 (2026.01)

(58) Field of Classification Search
CPC . H01L 23/49861; H01L 23/04; H01L 23/562; H01L 25/072; H01L 2224/48139; H10W 76/12; H10W 76/42
USPC ... 257/584, 683, 690, 692, 693, 696, 23.066
See application file for complete search history.

(56) References Cited

U.S. PATENT DOCUMENTS

| | | | | |
|---|---|---|---|---|
| 5,698,898 A | * | 12/1997 | Matsumoto | ........... H01L 23/473 257/784 |
| 5,763,946 A | | 6/1998 | Nakadaira et al. | |
| 2015/0061105 A1 | | 3/2015 | Oose | |

(Continued)

FOREIGN PATENT DOCUMENTS

| | | |
|---|---|---|
| DE | 19634202 A1 | 6/1997 |
| JP | H09-45831 A | 2/1997 |
| JP | H11-126842 A | 5/1999 |

(Continued)

OTHER PUBLICATIONS

International Search Report for PCT/JP2021/016651, mailed on Jul. 6, 2021.

(Continued)

*Primary Examiner* — David Chen
(74) *Attorney, Agent, or Firm* — Rabin & Berdo, P.C.

(57) ABSTRACT

A semiconductor module is provided with a semiconductor element, a case housing the semiconductor element, and an external terminal that electrically connects a main electrode of the semiconductor element to an external conductor. The external terminal projects out from a top face of the case and is bent at a right angle along the top face of the case. The case includes a protruding part that projects in a projection direction to a predetermined height above the top face of the case, and acts as a fulcrum for bending the external terminal, the protruding part having a slit that extends in a direction intersecting the projection direction to divide the protruding part.

15 Claims, 15 Drawing Sheets

(56)           References Cited

U.S. PATENT DOCUMENTS

2016/0225685 A1*   8/2016  Kodaira ................ H10W 76/15
2022/0181226 A1*   6/2022  Yamanaka ........ H01L 23/49524

FOREIGN PATENT DOCUMENTS

JP       2011-018933  A      1/2011
JP       2015-053301  A      3/2015
JP       2015-220188  A     12/2015
KR       1998023256  U      7/1998
WO       2014014066  A1     1/2014

OTHER PUBLICATIONS

Chinese Office Action issued for corresponding application
CN202180006820.X on May 16, 2025.
Action issued for corresponding German patent application No.
DE11 2021000173.6 on Oct. 31, 2025.

* cited by examiner

6

60

7

11d

16a

8a

11e

12b

11c

C1

8

11

12c

11a

17

16b

61

11f

6

60

7

16a

8a

11d

12b

11e

11c

C1

8

11

11a

17

16b

61

12c

11f

SEMICONDUCTOR MODULE WITH BENT EXTERNAL TERMINAL

CROSS REFERENCE TO RELATED APPLICATIONS

This is a continuation application of International Application PCT/JP2021/016651 filed on Apr. 26, 2021 which claims priority from a Japanese Patent Application No. 2020-103814 filed on Jun. 16, 2020, the contents of which are incorporated herein by reference.

TECHNICAL FIELD

The present invention relates to a semiconductor module.

BACKGROUND ART

Semiconductor devices have a substrate on which semiconductor elements such as an insulated-gate bipolar transistor (IGBT), a power metal-oxide-semiconductor field-effect transistor (power MOSFET), and a free-wheeling diode (FWD) are provided, and are used in apparatuses such as inverters.

In semiconductor modules of this type, semiconductor elements disposed on a predetermined substrate are housed in a resin case member for example. On the outer periphery of the case member, external terminals for connecting to a busbar or the like are provided. The external terminals are formed using a metal plate, and are disposed to project upward from the top face of the case. In addition, the ends of the projecting external terminals are bent at a right angle along the top face of the case (for example, refer to Patent Literature 1-3).

CITATION LIST

Patent Literature

Patent Literature 1: Japanese Patent Laid-Open No. 9-45831
Patent Literature 2: Japanese Patent Laid-Open No. 2015-53301
Patent Literature 3: Japanese Patent Laid-Open No. 2015-220188

SUMMARY OF INVENTION

Technical Problem

By the way, in the case of bending the external terminals at a right angle as described above, when the external force is removed from the ends of the external terminals, the ends of the external terminals are pushed back slightly due to spring-back caused by the elasticity of the external terminals. As a result, the end faces of the external terminals are not parallel to the top face of the case, which may affect the ability to attach components such as the busbar.

Accordingly, in Patent Literature 1 for example, electrode terminals which are the external terminals project out from the top face of the case, with protruding parts formed on the base end. The protruding parts project out at a predetermined height from the top face of the case, and act as the fulcrum for bending the electrode terminals. The heights of the protruding parts are set so as to be equal to the return distance of the ends of the external terminals due to spring-back after being bent. This arrangement makes it possible to control the bend angle of the electrode terminals to a substantially right angle.

However, the protruding parts described above are a part of a case formed using a resin or the like. For this reason, when the external terminals are bent, there is a possibility that stress may be concentrated at the protruding parts that act as the fulcrum, and damage the protruding parts.

An object of the present invention, which has been made in light of this point, is to provide a semiconductor module that can prevent damage to the case while also ensuring the bend angle of the external terminals.

Solution to Problem

A semiconductor module according to an aspect of the present invention is provided with a semiconductor element, a case that houses the semiconductor element, and an external terminal that electrically connects a main electrode of the semiconductor element to an external conductor, wherein the external terminal projects out from a top face of the case and is bent at a right angle along the top face of the case, and the case includes a protruding part that projects out at a predetermined height from the top face of the case and acts as a fulcrum for bending the external terminal, and a slit that divides the protruding part in a direction intersecting the projection direction of the protruding part.

Advantageous Effects of Invention

According to the present invention, it is possible to prevent damage to the case while also ensuring the bend angle of the external terminals.

DESCRIPTION OF EMBODIMENTS

Figure 1:
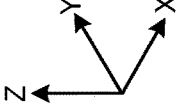
FIG. 1 is a perspective view of a semiconductor module according to an embodiment.
Figure 2:
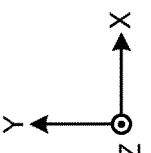
FIG. 2 is a plan view of a semiconductor module according to the embodiment.
Figure 3:
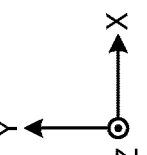
FIG. 3 is a plan view with the case removed from the semiconductor module illustrated in FIG. 2.

Hereinafter, a semiconductor module to which the present invention can be applied will be described. FIG. 1 is a perspective view of a semiconductor module according to the embodiment. FIG. 2 is a plan view of the semiconductor module according to the embodiment. FIG. 3 is a plan view with the case removed from the semiconductor module illustrated in FIG. 2. Note that the semiconductor module illustrated below is merely one non-limiting example, and may be modified appropriately.

Also, in the following diagrams, the longitudinal direction of the semiconductor module (the direction in which a plurality of multilayer substrates are arranged) is designated the X direction, the short direction of the semiconductor module is designated the Y direction, and the height direction (the substrate thickness direction) is designated the Z direction. The illustrated X, Y, and Z axes are orthogonal to each other and constitute a right-handed coordinate system. Additionally, in some cases, the X direction may be referred to as the left-right direction, the Y direction as the front-back direction, and the Z direction as the up-down direction. These directions (front-back, left-right, and up-down directions) are terms used for convenience in the description, and depending on the installed attitude of the semiconductor module, the correspondence relationships between these directions and the XYZ directions may change. For example, the surface on the heat-dissipating side (cooler side) of the semiconductor module is referred to as the bottom face, while the opposite side is referred to as the top face. Also, in this specification, a plan view means the case of viewing the top face of the semiconductor module from the positive Z direction. Also, in this specification, directional and angular notations may be rough directions and angles, and values within ±10 degrees may be tolerated.

The semiconductor module according to the embodiment is applied to a power conversion device such as a power module, for example, and is a power module that forms an inverter circuit. As illustrated in FIGS. 1-3, the semiconductor module 1 includes a base plate 10, a plurality of multilayer substrates 2 disposed on top of the base plate 10, a plurality of semiconductor elements 3, 4 disposed on top of the multilayer substrates 2, a case member 11 that houses the multilayer substrate 2 and the plurality of semiconductor elements, and an encapsulating resin (not illustrated) that fills the case member 11.

The base plate 10 is a rectangular plate having a top face and a bottom face. The base plate 10 functions as a heatsink. Additionally, the base plate 10 has a rectangular shape in a plan view having a long side in the X direction and a short side in the Y direction. The base plate 10 is a metal plate containing copper, aluminum, or an alloy thereof, for example. The surface of the base plate 10 may also be plated.

The case member 11 having a rectangular shape in a plan view is disposed on the top face of the base plate 10. The case member 11 is formed into a box shape with an open bottom so as to cover the top of the base plate 10 and the plurality of semiconductor elements. The case member 11 demarcates a space that houses the multilayer substrates 2, the semiconductor elements, the encapsulating resin, and the like.

In addition, the case member 11 is provided with external terminals. Specifically, the external terminals include a positive electrode terminal 12 (P terminal), a negative electrode terminal 13 (N terminal), and an output terminal 14 (M terminal). Furthermore, a plurality of control terminals 15 may be included among the external terminals. Each external terminal is inserted into a through-hole (through-hole 11c described later) provided in the case member 11. One end of each external terminal is connected to a predetermined circuit board inside the case member 11, and the other end is exposed to the outside on the top face of the case member 11.

In addition, the resin forming the case member 11 is a thermoplastic resin. Such a resin may be polyphenylene sulfide (PPS) resin, polybutylene terephthalate (PBT) resin, polybutylene succinate (PBS) resin, polyamide (PA) resin, acrylonitrile butadiene styrene (ABS), or the like. Moreover, a filler may also be added to the resin for the case member 11. The filler is ceramics, for example. Such a filler may be silicon oxide, aluminum oxide, boron nitride, aluminum nitride, or the like.

Specifically, a terminal placement part 11a is formed in the center of the top face of the case member 11. The positive electrode terminal 12, the negative electrode terminal 13, and the output terminal 14 are disposed in the terminal placement part 11a. Also, a plurality of terminal placement parts 11b, in which the control terminals 15 are disposed, are formed on the periphery of the case member 11. The terminal placement parts 11a and 11b are formed by a portion of the case member 11. The terminal placement part 11a has a cuboid shape that is long in the X direction. On the top face of the terminal placement part 11a, the respective end parts of the output terminal 14, the positive electrode terminal 12, and the negative electrode terminal 13 are arranged in the above order from the negative X side.

Each external terminal has a tabular shape. Each external terminal is formed by a process such as press working a metal plate such as a copper material, a copper alloy material, an aluminum alloy material, or an iron alloy material. Specifically, the positive electrode terminal 12 includes a first end part 12a, which is one end, a second end part 12b, which is the other end, and an intermediate part 12c between the first end part 12a and the second end part 12b.

A plurality of (six) first end parts 12a are provided in correspondence with the multilayer substrates 2. The six first end parts 12a are disposed inside the case member 11 and embedded in the encapsulating resin. The first end part 12a is connected to a predetermined circuit board (the circuit board 21 described later) inside the case member 11.

The intermediate part 12c is connected to the plurality of first end parts 12a on the side that is embedded in the encapsulating resin. Furthermore, the intermediate part 12c is formed in an elongated shape extending in the X direction inside the case member 11. In addition, the intermediate part 12c extends toward the top face of the case member 11 and is connected to the second end part 12b on the top face of the case member 11 through a through-hole (the through-hole 11c described later) provided in the case member 11.

The second end part 12b is disposed outside the case member 11. The second end part 12b projects out from the top face of the case member 11, with the leading end bent at a substantial right angle along the top face of the case member 11 (terminal placement part 11a). In other words, the main surface of the positive electrode terminal 12 is disposed along the inner wall face (opposing wall part 11f described later) and the top face of the terminal placement part 11a. Two second end parts 12b are arranged in the X direction. In the center of each second end part 12b, a through-hole 12d penetrating in the thickness direction is formed.

Also, a groove or projection may be formed on the main surface of the bent part that is the connecting portion between the intermediate part 12c and the second end part 12b. This configuration can make bending easier and also suppress cracks in the terminals.

Similarly, the negative electrode terminal 13 includes a first end part 13a, which is one end, a second end part 13b, which is the other end, and an intermediate part 13c between the first end part 13a and the second end part 13b. A plurality of (six) first end parts 13a are provided in correspondence with the multilayer substrates 2. The six first end parts 13a are disposed inside the case member 11 and embedded in the encapsulating resin. The first end parts 13a are connected to a predetermined circuit board (the circuit board 23 described later) inside the case member 11.

The intermediate part 13c is connected to the plurality of first end parts 13a on the side that is embedded in the encapsulating resin. Furthermore, the intermediate part 13c is formed in an elongated shape extending in the X direction inside the case member 11. In addition, the intermediate part 13c extends toward the top face of the case member 11 and is connected to the second end part 13b on the top face of the case member 11 through a through-hole (the through-hole 11c described later) provided in the case member 11. The second end part 13b is disposed outside the case member 11.

The second end part 13b is disposed outside the case member 11. The second end part 13b projects out from the top face of the case member 11, with the leading end bent at a substantial right angle along the top face of the case member 11 (terminal placement part 11a). In other words, the main surface of the negative electrode terminal 13 is disposed along the inner wall face (opposing wall part 11f described later) and the top face of the terminal placement part 11a. Two second end parts 13b are arranged in the X direction. In the center of each second end part 13b, a through-hole 13d penetrating in the thickness direction is formed.

Also, a groove or projection may be formed on the main surface of the bent part that is the connecting portion between the intermediate part 13c and the second end part 13b. This configuration can make bending easier and also suppress cracks in the terminals.

Also, the output terminal 14 includes a first end part 14a, which is one end, a second end part 14b, which is the other end, and an intermediate part 14c between the first end part 14a and the second end part 14b. A plurality of (six) first end parts 14a are provided in correspondence with the multilayer substrates 2. The six first end parts 14a are disposed inside the case member 11 and embedded in the encapsulating resin. The first end parts 14a are connected to a predetermined circuit board (the circuit board 22 described later) inside the case member 11.

The intermediate part 14c is connected to the plurality of first end parts 14a on the side that is embedded in the encapsulating resin. Furthermore, the intermediate part 14c is formed in an elongated shape extending in the X direction inside the case member 11. In addition, the intermediate part 14c extends toward the top face of the case member 11 and is connected to the second end part 14b on the top face of the case member 11 through a through-hole (the through-hole 11c described later) provided in the case member 11. The second end part 14b is disposed outside the case member 11.

The second end part 14b is disposed outside the case member 11. The second end part 14b projects out from the top face of the case member 11, with the leading end bent at a substantial right angle along the top face of the case member 11 (terminal placement part 11a). In other words, the main surface of the output terminal 14 is disposed along the inner wall face (opposing wall part 11f described later) and the top face of the terminal placement part 11a. Two second end parts 14b are arranged in the X direction. In the center of each second end part 14b, a through-hole 14d penetrating in the thickness direction is formed.

Also, a groove or projection may be formed on the main surface of the bent part that is the connecting portion between the intermediate part 14c and the second end part 14b. This configuration can make bending easier and also suppress cracks in the terminals.

Also, one end of each control terminal 15 is connected to a predetermined circuit board inside the case member 11. The other end of each control terminal 15 projects out from the top face of the case member 11, with the leading end bent at a substantial right angle along the top face of the case member 11 (terminal placement part 11b).

Although described in detail later, an external conductor 7 such as a busbar is fastened to each of these external terminals using a bolt 6 (see FIG. 5). In addition, the nut 8 into which the tip of the bolt 6 is screwed is disposed below the second end of each external terminal (see FIG. 5). The nut 8 is housed in a nut housing 16 (see FIG. 4) formed in each terminal placement part.

Also, on the inner side of the case member 11, six multilayer substrates 2 are disposed on the top face of the base plate 10. The multilayer substrates 2 are formed into a rectangular shape in a plan view, for example. The six multilayer substrates 2 are arranged in the X direction. The multilayer substrates 2 are formed by stacking metal layers and insulating layers, and include a direct copper bonding (DCB) substrate, an active metal brazing (AMB) substrate, or a metal base substrate, for example. Specifically, the multilayer substrates 2 include an insulating plate 20, a heatsink (not illustrated) disposed on the bottom face of the insulating plate 20, and circuit boards 21, 22, 23 disposed on the top face of the insulating plate 20.

The insulating plate 20 has a predetermined thickness in the Z direction, and is formed into a tabular shape having a top face and a bottom face. The insulating plate 20 is formed by a ceramic material such as alumina ($Al_2O_3$), aluminum nitride (AlN), or silicon nitride ($Si_3N_4$), a resin material such as epoxy, or an insulating material such as an epoxy resin material using a ceramic material as a filler, for example. Note that the insulating plate 20 may also be referred to as an insulating layer or an insulating film.

The heatsink has a predetermined thickness in the Z direction, and is formed so as to cover substantially the entire bottom face of the insulating plate. The heatsink is formed by a metal plate with favorable thermal conductivity, such as copper or aluminum, for example.

On the top face (main surface) of the insulating plate 20, the three circuit boards 21, 22, 23 are formed as independent islands that are electrically insulated from each other. Also, besides the three circuit boards 21, 22, 23, two circuit boards 24 are disposed as circuit boards for control. The two circuit boards 24 are provided in a pair of diagonally opposite corners of the insulating plate 20. These circuit boards contain a metal layer of predetermined thickness formed by copper foil or the like.

The end parts of the external terminals described above are connected to the top faces of these circuit boards. Specifically, the first end part 12a of the positive electrode terminal 12 is disposed on the top face of the circuit board 21. Additionally, semiconductor elements 3, 4 described later are disposed on the top face of the circuit board 21. The first end part 14a of the output terminal 14 is disposed on the top face of the circuit board 22. Additionally, the semiconductor elements 3, 4 described later are disposed on the top face of the circuit board 22. The first end part 13a of the negative electrode terminal 13 is disposed on the top face of the circuit board 23. The respective first end parts of these external terminals are connected to the top face of a predetermined circuit board, either directly by ultrasonic welding, laser welding, or the like, or through a bonding material such as solder or sintered metal. With this configuration, the respective first end parts 12a, 13a, 14a of the external terminals are conductively connected to the circuit boards 21, 23, 22.

The plurality of semiconductor elements 3, 4 are disposed on the top face of the circuit boards 21, 22 through a bonding material such as solder. With this configuration, respective bottom electrodes of the semiconductor elements 3, 4 are conductively connected to the circuit boards 21, 22. Accordingly, the external terminals and the semiconductor elements are conductively connected.

The semiconductor elements 3, 4 are formed having a square shape in a plan view by a semiconductor substrate such as silicon (Si), silicon carbide (SiC), or gallium nitride (GaN), for example. Note that a switching element such as an insulated-gate bipolar transistor (IGBT) or a power metal-oxide-semiconductor field-effect transistor (power MOSFET), or a diode such as a free-wheeling diode (FWD), is used as each of the semiconductor elements 3, 4. Hereinafter, in the embodiment, one semiconductor element 3 is designated an IGBT element while the other semiconductor element 4 is designated a diode element. Also, an element such as a reverse-conducting IGBT (RC-IGBT) element that combines an IGBT and an FWD in one, a power MOSFET element, or a reverse-blocking IGBT (RB-IGBT) having a sufficient withstand voltage with respect to a reverse bias may also be used as each of the semiconductor elements. Also, properties such as the shape, number, and placement of the semiconductor elements may be changed appropriately. Note that the semiconductor elements according to the embodiment are vertical switching elements in which a functional element such as a transistor is formed on a semiconductor substrate.

In this embodiment, one of each of the semiconductor elements 3, 4 are arranged in the Y direction on the top face of the circuit board 21. On the circuit board 21, the semiconductor element 3 is positioned on the positive Y side and the semiconductor element 4 is positioned on the negative Y side. Similarly, on the top face of the circuit board 22, one of each of the semiconductor elements 3, 4 are arranged in the Y direction. On the circuit board 22, the semiconductor element 4 is positioned on the positive Y side and the semiconductor element 3 is positioned on the negative Y side. In this embodiment, the semiconductor elements 3, 4 on the circuit board 21 form an upper arm, while the semiconductor elements 3, 4 on the circuit board 22 form a lower arm.

In addition, the semiconductor elements 3, 4 arranged in the Y direction are electrically connected by a wiring member. The semiconductor element 4 and a predetermined circuit board are also electrically connected by a wiring member. Furthermore, a gate electrode of the semiconductor element 3 and the circuit board 24 are also electrically connected by a wiring member.

Conductor wires (bonding wires) are used as these wiring members. Gold, copper, aluminum, gold alloy, copper alloy, and aluminum alloy can be used either singly or in combination with each other as the material of the conductor wires. Additionally, it is also possible to use members other than conductor wires as the wiring members. For example, ribbons can be used as the wiring members. Furthermore, the wiring members are not limited to wires or the like, and may also be formed by a metal plate such as a copper material, a copper alloy material, an aluminum alloy material, or an iron alloy material, for example.

Figure 4:
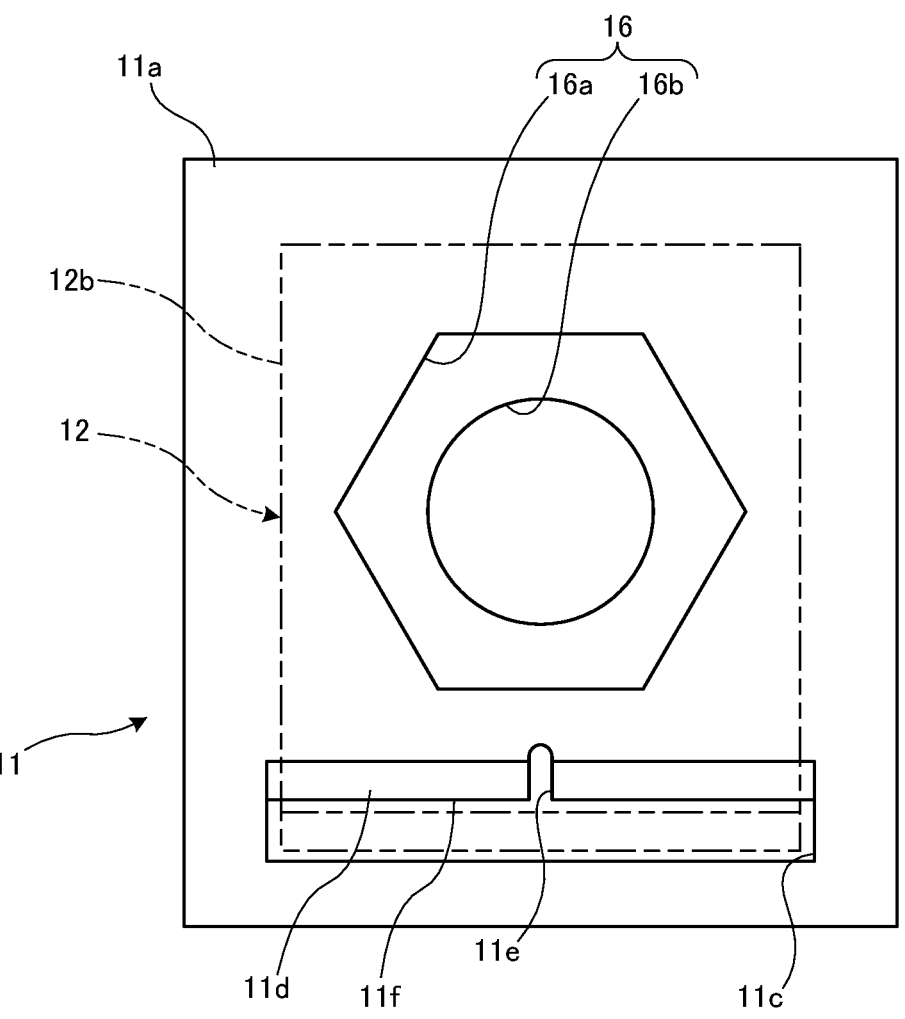
FIG. 4 is a plan view of the area around an external terminal according to the embodiment.
Figure 4:
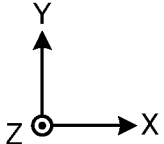
Figure 5:
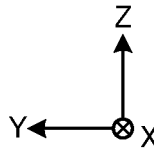
FIG. 5 is a partial cross section of the area around the external terminal illustrated in FIG. 4.

Next, FIGS. 4 and 5 will be referenced to describe a structure for securing an external conductor according to the embodiment in detail. FIG. 4 is a plan view of the area around an external terminal according to the embodiment. FIG. 5 is a partial cross section of the area around the external terminal illustrated in FIG. 4. Note that in FIG. 4, the case member 11 is illustrated with solid lines, and the outline of the external terminal 12 is illustrated with chain double-dashed lines. In FIG. 5, the case member 11, the external terminal 12, and the nut 8 are illustrated with solid lines, and the outlines of the bolt 6 and the external conductor 7 are illustrated with chain double-dashed lines. In FIGS. 4 and 5, the structure surrounding the positive electrode terminal 12 is described as an example for convenience, but the structure is not limited to the positive electrode terminal 12. The areas around the negative electrode terminal 13 and the output terminal 14 are also assumed to have a similar structure. Moreover, a similar structure may also be adopted for the control terminals 15.

As illustrated in FIGS. 4 and 5, on the top face of the case member 11 (terminal placement part 11a), the through-hole 11c that penetrates the space inside and the outside of the case member 11 is formed. The intermediate part 12c standing up in the Z direction between the first end part 12a and the second end part 12b of the positive electrode terminal 12 is inserted into the through-hole 11c. The through-hole 11c has a long, flat shape in the X direction. The through-hole 11c is preferably rectangular in a plan view, more preferably slightly larger than the width and thickness of the cross section of the intermediate part 12c of the positive electrode terminal 12 inserted into the through-hole 11c.

Also, a protruding part 11d that projects upward in the Z direction is formed beside the through-hole 11c in the short direction. The protruding part 11d is formed in an elongated shape extending in the X direction along the long side of the inner wall surface (opposing wall part 11f described later) of the through-hole 11c on the positive Y side of the through-hole 11c. The protruding part 11d is a cuboid shape or a cuboid shape with a fillet formed on the top face, and furthermore may also be a semi-cylindrical shape.

The height (length in the Z direction) of the protruding part 11d is 10% or greater and 150% or less than the thickness of the second end part 12b. The width (length in the Y direction) of the protruding part 11d is 10% or greater and 150% or less than the thickness of the second end part 12b. Setting the height and width in this range makes it possible to bend the terminal with consideration for spring-back described later.

Also, the length (length in the X direction) of the protruding part 11d is 70% or greater and 150% or less than the width of the second end part 12b. Preferably, the length of the protruding part 11d is 80% or greater and 120% or less than the width of the second end part 12b. Also, the length (length in the X direction) of the protruding part 11d is 70% or greater and 150% or less than the length of the through-hole 11c. Preferably, the length (length in the X direction) of the protruding part 11d is 100% or greater and 120% or less than the width of the through-hole 11c, and the two end parts (the end parts in the X direction) of the protruding part 11d are on the outside of the two end parts (end parts in the X direction) of the through-hole 11c. With this configuration, stress concentration on the two end parts (end parts in the X direction) of the protruding part 11d can be suppressed.

Additionally, although described in detail later, a slit 11e extending in the Z direction is formed on the inner surface (opposing wall part 11f described later) and the protruding part 11d of the through-hole 11c. Furthermore, a fillet 11g (see FIG. 8) may also be formed on both end parts of the inner surface (opposing wall part 11f) of the through-hole 11c.

As described above, the second end part 12b projects out from the top face of the case member 11, with the leading end bent at a substantial right angle along the top face of the case member 11 (terminal placement part 11a) and toward the positive Y side. At this time, the protruding part 11d acts as a fulcrum for bending the second end part 12b, and a slight gap C1 is provided between the top face of the terminal placement part 11a and the bottom face of the second end part 13b. The size of the gap C1 is 80% or greater and 120% or less than the height of the protruding part 11d. Preferably, the size of the gap C1 is the same as the height of the protruding part.

Also, the nut housing 16 for housing the nut 8 is formed on the top face of the terminal placement part 11a. The nut 8 is what is called a hexagonal nut with a screw hole 8a formed in the center. The nut 8 is formed by penetrating the screw hole 8a through the axial center of a hexagonal cylinder, for example.

The nut housing 16 is provided in correspondence with the through-hole 11c. Specifically, the nut housing 16 is formed near the through-hole 11c at a predetermined position on the negative Y side of the through-hole 11c. The nut housing 16 includes a first recess 16a that houses the nut 8 and a second recess 16b that houses the tip of a screw part 61 of the bolt 6.

The first recess 16a is an indentation that has an opening in the top face of the terminal placement part 11a, extends in the −Z direction for a length that is the same or slightly longer than the outline of the nut 8, and has a floor surface. Note that the floor surface has a round opening that is concentric with the opening formed in the top face, smaller than the outline of the nut 8, and slightly wider than the outer diameter of the screw part 61 of the bolt 6. The first recess 16a is formed at a position distanced in the positive Y direction from the through-hole 11c. In other words, the first recess 16a is formed facing opposite the intermediate part that stands up in the Z direction of the positive electrode terminal 12. The first recess 16a has a regular hexagonal shape in a plan view corresponding to the shape of the nut 8. The first recess 16a is formed such that one of the pairs of opposing faces defining the hexagonal shape face each other in the Y direction. In other words, the direction in which one of the pairs of opposing faces that define the hexagonal shape of the first recess 16a face each other is the same as the direction facing opposite the positive electrode terminal 12 standing up in the Z direction. One side face of the first recess 16a and the main surface of the intermediate part of the positive electrode terminal 12 face each other in parallel. Also, the first recess 16a is formed such that the depth corresponds to the thickness of the nut 8.

Additionally, there may be a second recess 16b in the floor surface of the first recess 16a. The second recess 16b has a hole formed to a predetermined depth from the center of the floor surface of the first recess 16a. The second recess 16b has a round shape that is concentric with the first recess 16a, narrower than the inner diameter of the first recess 16a, and slightly wider than the outer diameter of the screw part 61 of the bolt 6.

The bottom of the second recess 16b may be closed off by the case member 11, without penetrating through to the interior of the case member 11. In this case, the second recess 16b is formed deeper than the bottom end of the screw part 61 screwed into the nut 8. Alternatively, the second recess 16b may penetrate through a void 17. Also, the center of the nut housing 16 (second recess 16b) is aligned with the center of the through-hole 12c of the second end part 12b. In other words, the second end part 12b and the nut housing 16 face opposite each other in the Z direction.

The thickness (length in the Z direction) of the terminal placement part 11a may be greater than the combined depth of the first recess 16a and the second recess 16b. Also, the depth (length in the Z direction) of the through-hole 11c is the same as the thickness of the terminal placement part 11a. For this reason, the depth of the through-hole 11c may be greater than the combined depth of the first recess 16a and the second recess 16b. Conversely, the thickness (length in the Z direction) of the terminal placement part 11a may be less than the combined depth of the first recess 16a and the second recess 16b. Also, the depth (length in the Z direction) of the through-hole 11c is the same as the thickness of the terminal placement part 11a. For this reason, the depth of the through-hole 11c may be less than the combined depth of the first recess 16a and the second recess 16b.

To eliminate thick portions of the terminal placement part 11a, a void 17 is formed in areas other than the nut housing 16 and the through-hole 11c. The void 17 is formed on the inner side of the case while leaving a prescribed thickness between the external space, the nut housing 16, and the through-hole 11c. For example, the void 17 may be formed between the second recess 16b and the through-hole 11c, like in FIG. 5.

Figure 6A:
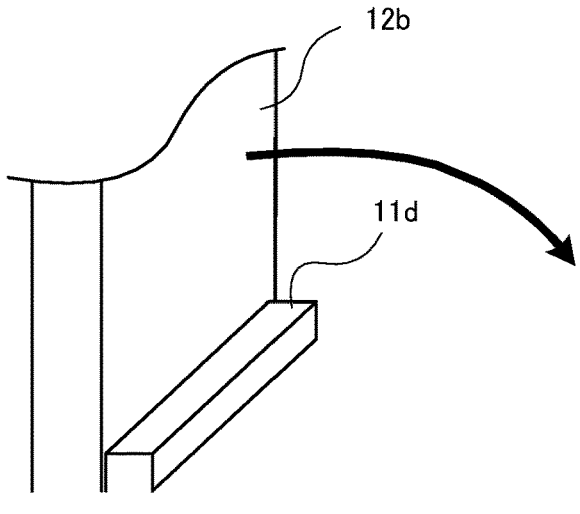
FIGS. 6A-6C are motion transition diagrams illustrating an example of an external terminal bending step.
Figure 6B:
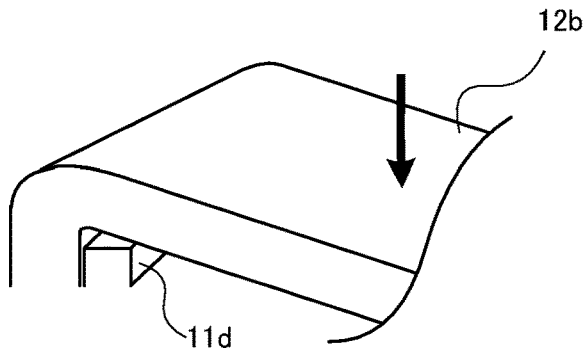
Figure 6C:
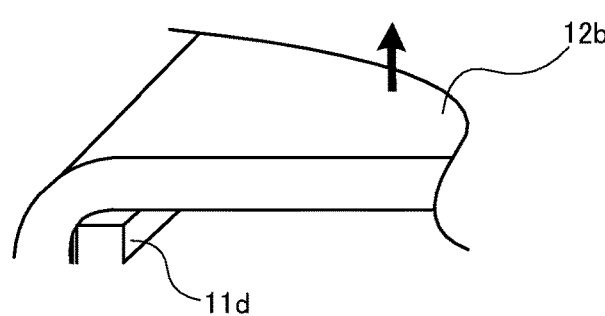
Figure 7A:
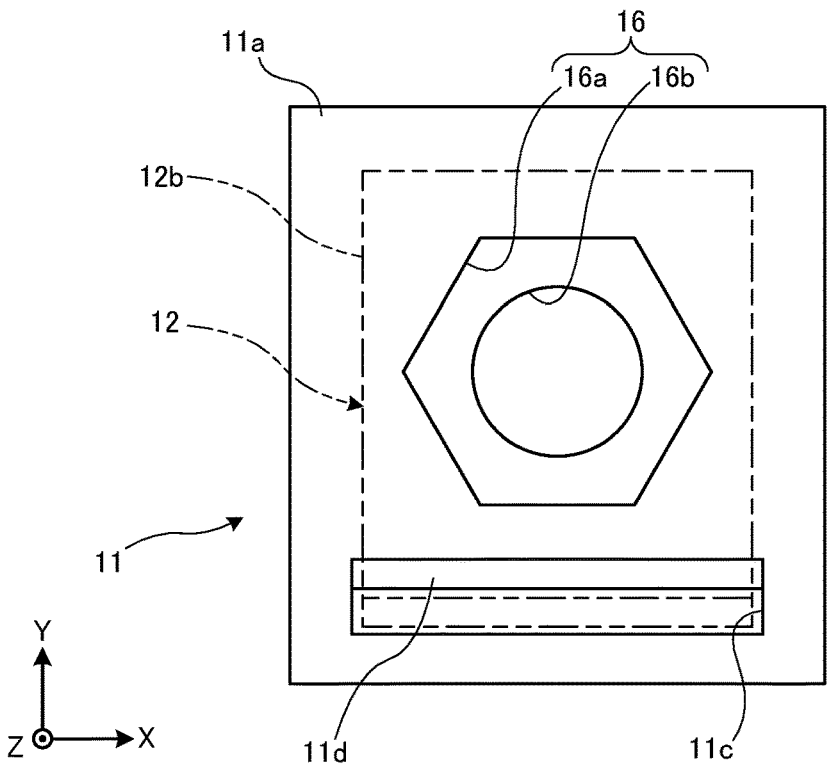
FIGS. 7A and 7B are structural views of the area around an external terminal according to a reference example.
Figure 7B:
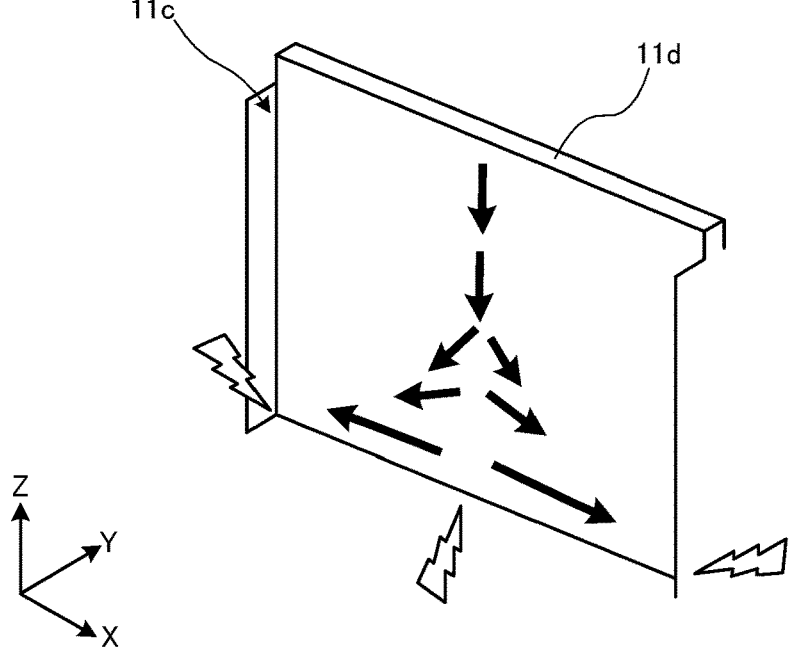
Figure 8A:
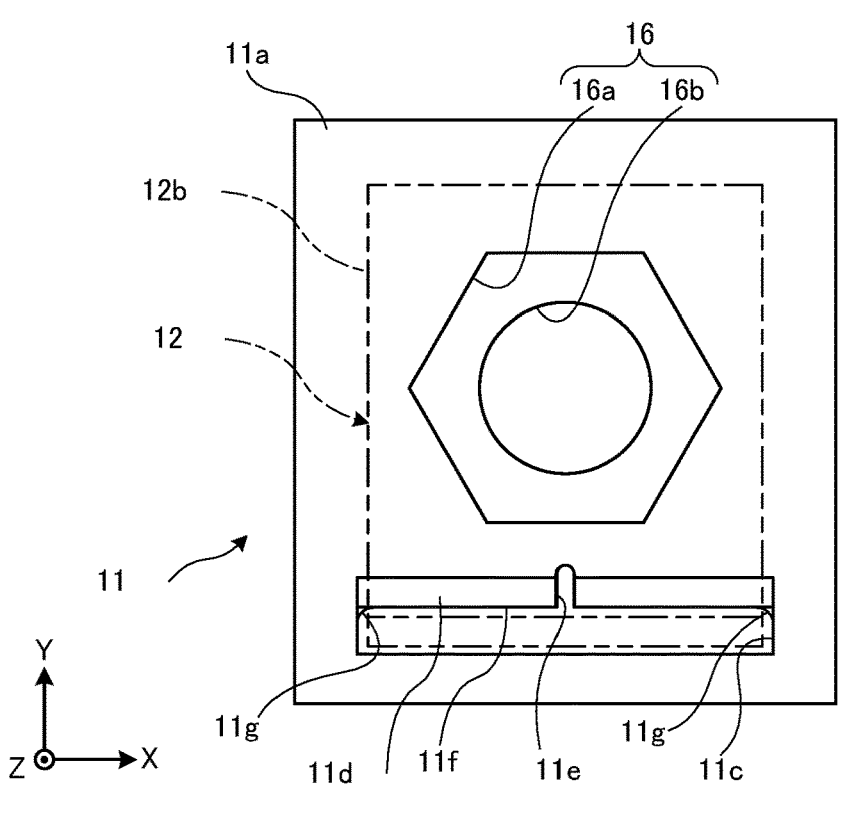
FIGS. 8A and 8B are structural view of the area around the external terminal according to the embodiment.
Figure 8B:
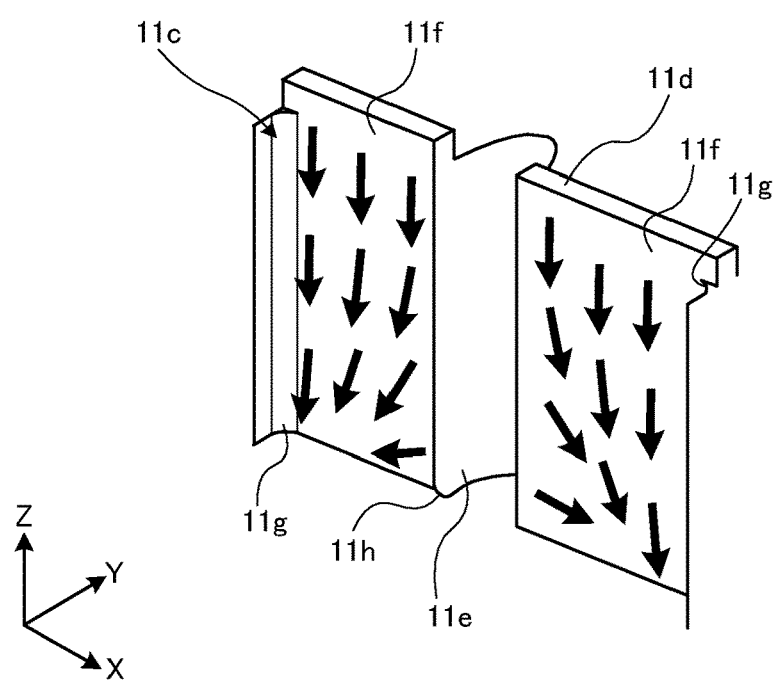

Next, FIGS. 6 to 8 will be referenced to describe a structure for bending an external terminal according to the embodiment. FIGS. 6A-6C are motion transition diagrams illustrating an example of an external terminal bending step. FIGS. 7A and 7B are structural views of the area around an external terminal according to a reference example. FIGS. 8A and 8B are structural views of the area around the external terminal according to the embodiment. In FIGS. 7A and 8B, the A diagram is a plan view of the area around the external terminal, and the B diagram is a perspective view of the area near the through-hole 11c.

By the way, in the semiconductor module described above, external terminals project out from the top face of the case member 11. In the semiconductor module manufacturing process, the end parts of the external terminals projecting out from the top face of the case member 11 are bent such that the main surface is at a right angle along the top face of the case member 11. At this time, when the external force is removed from the ends of the external terminals, the ends of the external terminals are pushed back slightly due to spring-back caused by the elasticity of the external terminals. As a result, the end faces of the external terminals are not parallel to the top face of the case, which may affect the ability to attach components such as the busbar.

Accordingly, as illustrated in FIG. 6A for example, it is conceivable to provide the protruding part 11d at the location that acts as the fulcrum for bending an external terminal (second end part 12b). By providing the protruding part 11d, it is possible to bend the second end part 12b 90 degrees or more by using the protruding part 11d as the fulcrum (see FIG. 6B). The height of the protruding part 11d is set so as to be equal to the return distance of the end of the external terminal due to spring-back after being bent. In other words, the height of the protruding part 11d is set with consideration for the amount of spring-back that occurs when the external force imposed during the bending is removed. This arrangement makes it possible to control the bend angle of the external terminal to a substantially right angle (see FIG. 6C).

However, as illustrated in FIG. 7A, the protruding part 11*d* described above is a part of the case member 11 formed using a resin or the like. For this reason, when the second end part 12*b* is bent, there is a possibility that stress may be concentrated at the protruding part 11*d* that act as the fulcrum, and damage the protruding part 11*d*. Specifically, force works from the top of the protruding part 11*d* downward along the inner surface of the through-hole 11*c* and spreads to either side in the X direction at the bottom, and stress is concentrated in the edge portions of the through-hole 11*c*.

In this way, the inventor focused on the areas where stress is concentrated when the protruding part 11*d* for controlling the bend angle of an external terminal is provided, and conceived of the present invention. Specifically, in the present embodiment, as illustrated in FIGS. 4, 5, and 8, the second end part 12*b* of the external terminal (positive electrode terminal 12) projects out from the top face of the case member 11 and is bent at a right angle along the top face of the case member 11. The case member 11 includes the protruding part 11*d* that projects out a predetermined height from the top face of the terminal placement part 11*a* and acts as the fulcrum for bending the second end part 12*b*, and a slit 11*e* that divides the protruding part 11*d* in the direction (X direction) intersecting the projection direction (Z direction) of the protruding part 11*d*.

Additionally, the case member 11 includes an opposing wall part 11*f* that faces one side of the positive electrode terminal 12 standing up in the Z direction. The protruding part 11*d* is formed along the opposing wall part 11*f*. In other words, the opposing wall part 11*f* is smoothly continuous with the end face of the protruding part 11*d*.

The slit 11*e* extends up and down in the Z direction, that is, the projection direction of the protruding part 11*d*. Also, the bottom end of the slit 11*e* is formed all the way to the bottom end of the opposing wall part 11*f*. The depth (length in the Y direction) of the slit 11*e* with respect to the opposing wall part 11*f* is equal to or greater than the width (length in the Y direction) of the protruding part 11*d*, and equal to or less than the length from the opposing wall part 11*f* to the nut housing 16. In other words, it is sufficient if the slit 11*e* is at least a depth that divides the protruding part 11*d*. The slit 11*e* is formed in a central portion of the protruding part 11*d* in the length direction (X direction).

According to the above configuration, the opposing wall part 11*f* is divided into two sections in the X direction by the slit 11*e*. With this arrangement, the force imparted to the top of the protruding part 11*d* when bending the external terminal propagates along the divided plurality of opposing wall parts 11*f*. In other words, the force that had been concentrated in a single location is dispersed along the plurality of opposing wall parts 11*f*. Consequently, it is possible to reduce the concentration of stress at the corners of the case member 11. Therefore, it is possible to prevent damage to the protruding part 11*d* and damage to the case corners. In other words, it is possible to prevent damage to the case member 11 while also ensuring the bend angle of the external terminal.

Also, the bottom part of the slit 11*e* is formed into an arc shape in the depth direction (Y direction) with respect to the opposing wall parts 11*f*. In other words, the end face of the slit 11*e* is formed as a curved surface that traces a curve in a plan view. According to this configuration, the concentration of stress at the end face of the slit 11*e* can be prevented, making it possible to reduce the occurrence of cracks starting from the slit 11*e*.

Also, as illustrated in FIGS. 8A and 8B, a fillet 11*g* of predetermined radius may also be formed on either end of the inner surface of the through-hole 11*c* (opposing wall parts 11*f*). Furthermore, a fillet 11*h* of predetermined radius may also be formed in the bottom part of the through-hole 11*c*. By providing a fillet shape at the corners of the through-hole 11*c* in this way, it is possible to reduce the concentration of stress at the corners.

Figure 9:
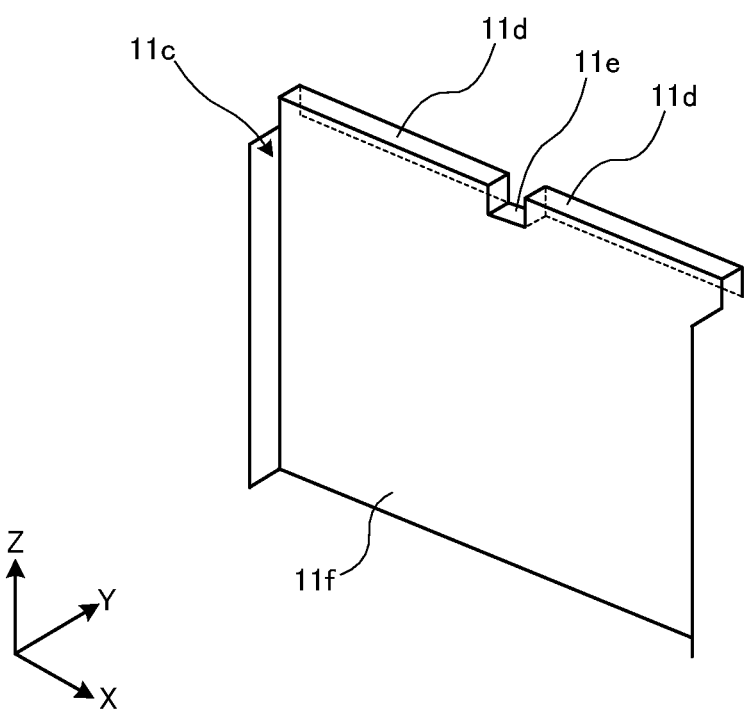
FIG. 9 is a structural view of the area around an external terminal according to a modification.

Also, the above embodiment describes a case where the slit 11*e* is formed all the way to the bottom end of the opposing wall part 11*f*, or in other words, a case where the opposing wall part 11*f* is completely divided into multiple sections in the X direction, but the configuration is not limited thereto. For example, the slit 11*e* may be formed only in the protruding part 11*d*, like the modification illustrated in FIG. 9. In this case, the protruding part 11*d* is divided into multiple sections (in FIG. 9, two) by the slit 11*e*. With such a configuration, it is likewise possible to prevent the concentration of stress with respect to the slit 11*e* and reduce the occurrence of cracks.

Figure 11A:
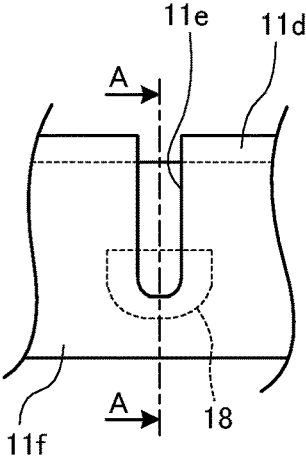
FIGS. 11A and 11B are structural views of the area around an external terminal according to a modification.
Figure 11A:
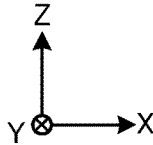
Figure 11B:
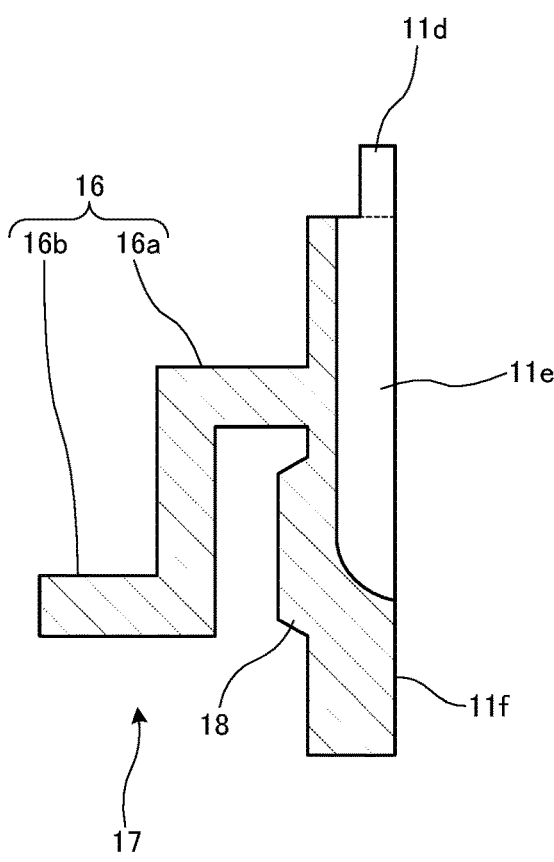
Figure 11B:
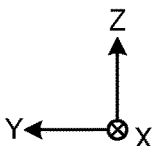

In addition, the configuration illustrated in FIGS. 11A and 11B is also possible. FIG. 11A illustrates the structure around an external terminal according to another modification, and FIG. 11B is a cross section cut along the line A-A in FIG. 11A. Like the modification in FIG. 11, the bottom end of the slit 11*e* may also be formed down to a partial height in the Z direction from the top end of the protruding part 11*d*. In this case, the bottom end of the slit 11*e* in the Z direction is formed into an arc shape. According to this configuration, the concentration of stress at the bottom edge of the slit 11*e* can be prevented, making it possible to reduce the occurrence of cracks starting from the slit 11*e*.

Also, in FIGS. 11A and 11B, a thick part 18 is formed in the area corresponding to the bottom end of the slit 11*e*. The thick part 18 functions as a reinforcement for increasing the rigidity of the opposing wall part 11*f* around the slit 11*e*. The thick part 18 has a bulging shape thickened toward the void 17 on the inner side (back surface side) of the opposing wall part 11*f*. Also, the thick part 18 is provided in an area facing the second recess. By thickening the back surface of the opposing wall part 11*f* corresponding to the bottom end of the slit 11*e*, it is possible to reduce the occurrence of cracks starting from the bottom end of the slit 11*e* and reaching the back surface of the opposing wall part 11*f*.

Figure 10:
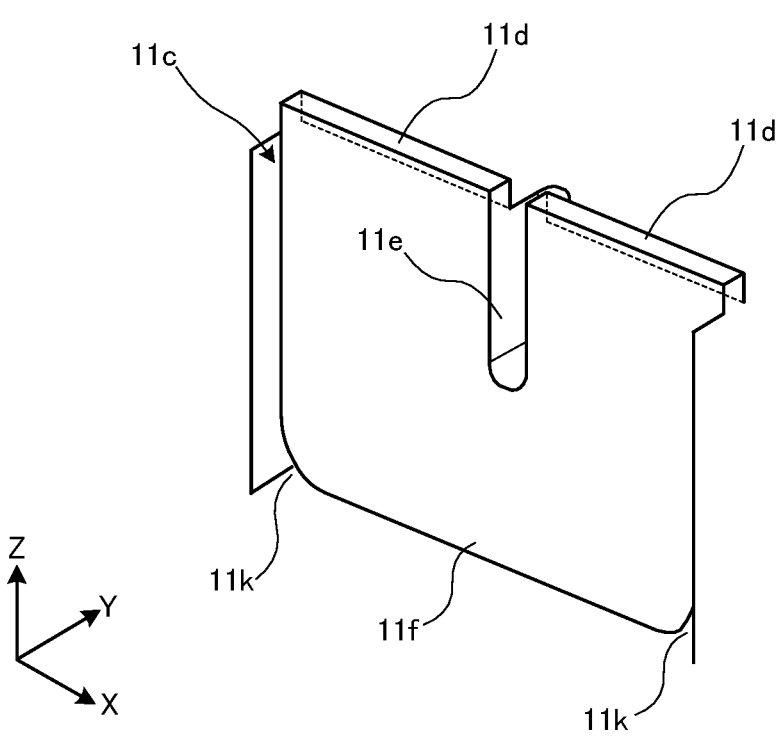
FIG. 10 is a structural view of the area around an external terminal according to a modification.

In addition, the configuration illustrated in FIG. 10 is also possible. In FIG. 10, two slits 11*k* (second slits) are provided in the bottom edge portions of the opposing wall part 11*f*. The slits 11*k* are formed such that the bottom ends of the opposing wall part 11*f* create an R shape (fillet shape). This configuration makes it possible to reduce the occurrence of cracks at the bottom edges of the opposing wall part 11*f* and the central bottom end of the opposing wall part 11*f*.

Figure 12A:
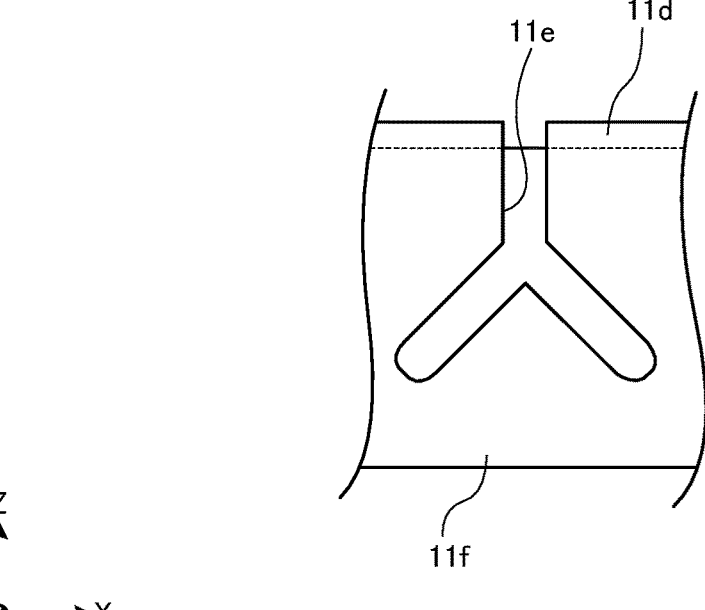
FIGS. 12A and 12B are structural views of the area around an external terminal according to a modification.
Figure 12B:
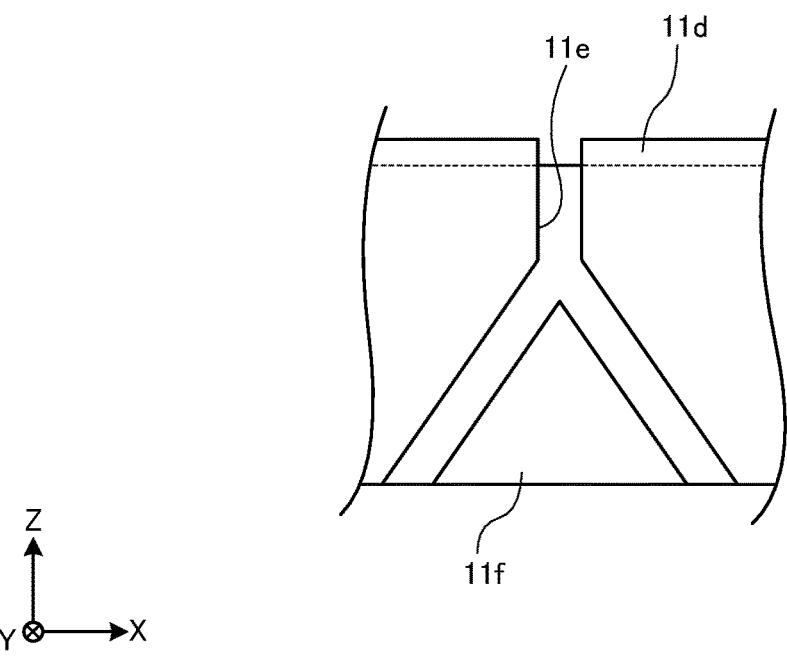

Also, the bottom end of the slit 11*e* may diverge into multiple paths, like the modification illustrated in FIGS. 12A and 12B. In FIG. 12A, the bottom end of the slit 11*e* diverges into two paths to create an approximate Y shape. In this case, the bottom end of the slit 11*e* in the Z direction ends partway through, and the ends are formed into an arc shape. Also, like FIGS. 11A and 11B, the thick part 18 may be formed in the opposing wall part 11*f* at the bottom end of the slit 11*e* as a reinforcement. For example, the reinforcement 18 can be formed by thickening the back surface of the opposing wall part 11*f* corresponding to the bottom end of the slit 11*e*.

Additionally, as illustrated in FIG. 12B, the slit 11e diverging into multiple paths may also be formed all the way to the bottom end of the opposing wall part 11f.

Figure 13A:
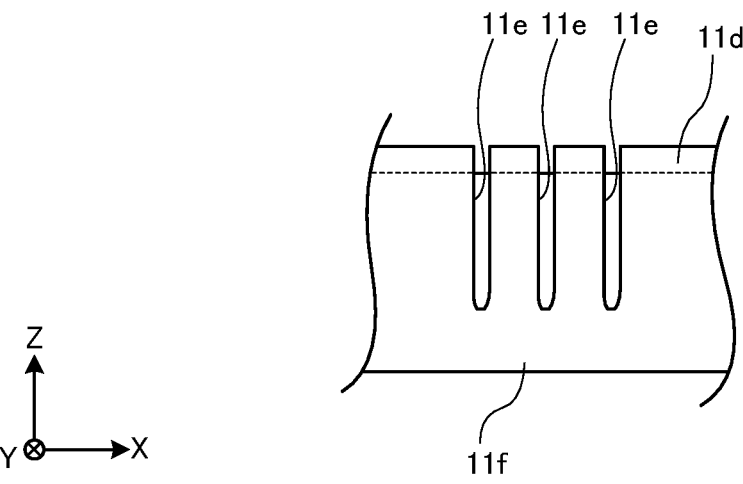
FIGS. 13A and 13B are structural views of the area around an external terminal according to a modification.
Figure 13B:
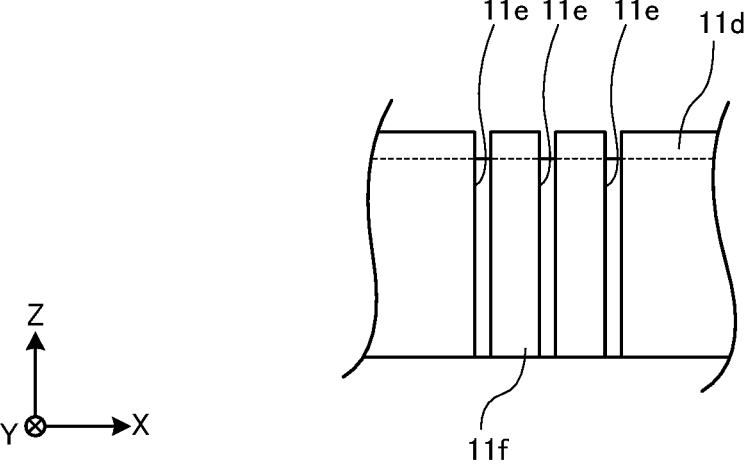

Also, as illustrated in FIG. 13A, a plurality of slits 11e may also be formed and arranged in the direction (X direction) intersecting the projection direction (Z direction) of the protruding part 11d. Furthermore, as illustrated in FIG. 13B, the plurality of slits 11e may also be formed all the way to the bottom end of the opposing wall part 11f.

Figure 14:
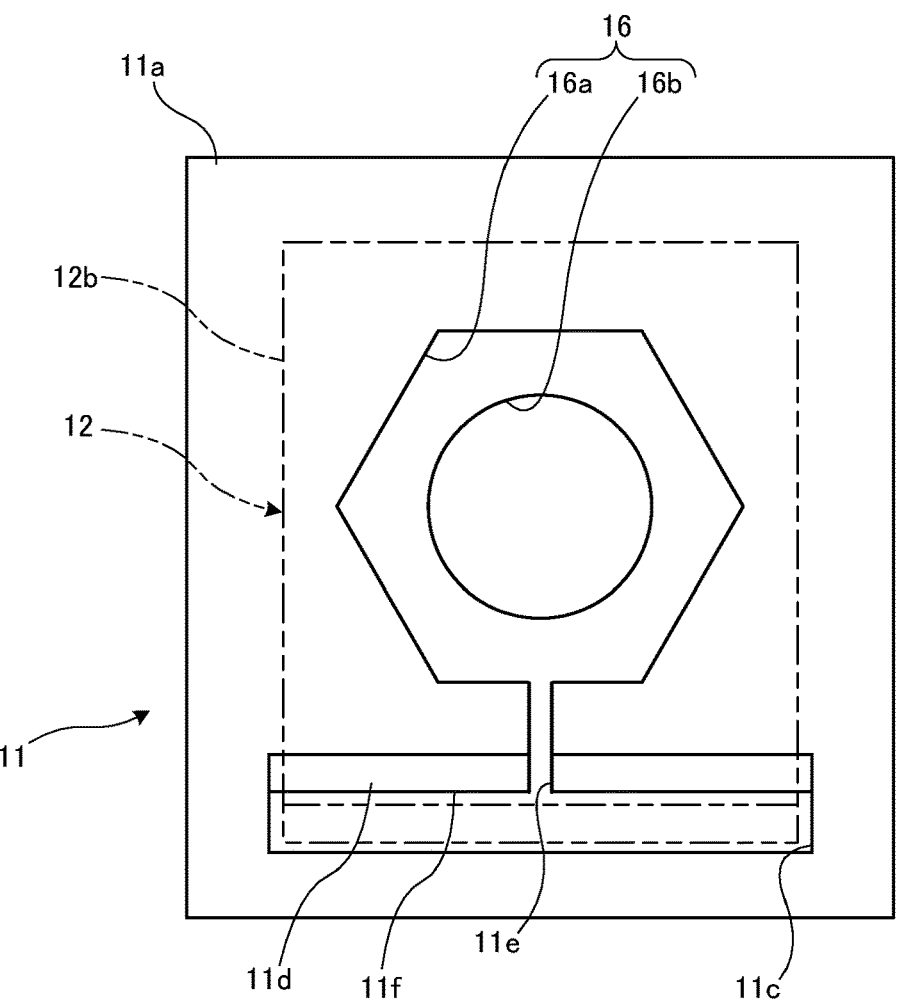
FIG. 14 is a structural view of the area around an external terminal according to a modification.
Figure 14:
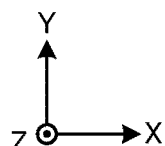
Figure 15:
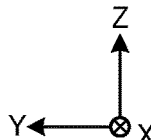
FIG. 15 is a structural view of the area around an external terminal according to a modification.

Also, the above embodiment describes a case where the slit 11e is not connected to the nut housing in the Y direction and stops before reaching the nut housing, or in other words, stops partway through the opposing wall part 11f in the Y direction, but the configuration is not limited thereto. For example, the configuration illustrated in FIGS. 14 and 15 is also possible. FIGS. 14 and 15 illustrate a case where the slit 11e is connected to the nut housing 16. In FIGS. 14 and 15, the slit 11e is formed to penetrate into the first recess 16a. Note the slit 11e may also be formed to penetrate into the second recess 16b. Furthermore, the slit 11e may also be connected to the void 17 underneath. This configuration makes it possible to suppress the occurrence of cracks starting from the edge of the slit 11e in the Y direction.

Furthermore, the above embodiment describes a case where the slit 11e is formed at a position facing one side of the first recess 16a in the center of the opposing wall part 11f in the X direction, but the configuration is not limited thereto. The slit 11e may also be disposed off-center on one side in the X direction.

Also, the above embodiment describes a case where the slit 11e extends straight in the vertical direction (Z direction), but the configuration is not limited thereto. The slit 11e may also be tilted obliquely. In this case, the slit 11e is preferably tilted such that the bottom end is farther outward than the top end.

In addition, the above embodiment describes a case where the through-hole 11c for inserting the external terminal into the case member 11 is formed, but the configuration is not limited thereto. It is not strictly necessary to form the through-hole 11c, and a configuration in which the external terminal is integrally embedded into the case member 11 is also possible. Moreover, the case member 11 may also be the combination of a case frame and a case lid, and in this case, the through-hole 11c may be formed by the boundary between the case frame and the case lid.

Also, in the above embodiment, the number and layout of circuit boards is not limited to the above configuration and may be changed appropriately.

Also, the above embodiment takes a configuration in which the multilayer substrates 2 and the semiconductor elements are formed in a rectangular or square shape in a plan view, but the embodiment is not limited to this configuration. The multilayer substrates 2 and the semiconductor elements may also be formed in a polygonal shape other than the above.

In addition, the present embodiment and modifications have been described, but the above embodiment and the modifications may also be combined in full or in part and treated as another embodiment.

Also, the present embodiment is not limited to the above embodiment and modifications, and various modifications, substitutions, and alterations are possible without departing from the scope of the technical idea. Further, if the technical idea can be achieved according to another method through the advancement of the technology or another derivative technology, the technical idea may be implemented using the method. Consequently, the claims cover all embodiments which may be included in the scope of the technical idea.

Features of the above embodiment are summarized below.

A semiconductor module according to the above embodiment is provided with a semiconductor element, a case that houses the semiconductor element, and an external terminal that electrically connects a main electrode of the semiconductor element to an external conductor, wherein the external terminal projects out from a top face of the case and is bent at a right angle along the top face of the case, and the case includes a protruding part that projects out at a predetermined height from the top face of the case and acts as a fulcrum for bending the external terminal, and a slit that divides the protruding part in a direction intersecting the projection direction of the protruding part.

Also, in the semiconductor module described in the above embodiment, the case has an opposing wall part that faces one side of the external terminal, the protruding part is formed along a top end of the opposing wall part, and the slit extends up and down along the projection direction of the protruding part, and a bottom end of the slit is formed all the way to the opposing wall part.

Also, in the semiconductor module described in the above embodiment, the bottom end of the slit is formed all the way to a bottom end of the opposing wall part.

Also, in the semiconductor module described in the above embodiment, the bottom end of the slit is formed partway through the opposing wall part, and is formed into an arc shape.

Also, in the semiconductor module described in the above embodiment, a bottom part of the slit in a depth direction with respect to the opposing wall part is formed into an arc shape.

Also, in the semiconductor module described in the above embodiment, the slit is formed to penetrate into a recess for housing a nut.

Also, in the semiconductor module described in the above embodiment, a plurality of slits are formed and arranged in a direction intersecting the projection direction of the protruding part.

Also, in the semiconductor module described in the above embodiment, a bottom end of the slit diverges into a plurality of paths.

Also, in the semiconductor module described in the above embodiment, the case further includes a through-hole into which the external terminal is insertable, the through-hole is rectangular in a plan view and is formed slightly larger than a width and thickness of a cross section of the external terminal, and the external terminal is inserted into the through-hole from inside the case and projects out from the top face of the case.

Also, in the semiconductor module described in the above embodiment, the case further includes a reinforcement in an area corresponding to a bottom end of the slit.

Also, in the semiconductor module described in the above embodiment, the case has an opposing wall part that faces one side of the external terminal, and the reinforcement is formed by a thick part thickened on a back surface side of the opposing wall part.

Also, in the semiconductor module described in the above embodiment, the case has an opposing wall part that faces one side of the external terminal, and a second slit is formed on a bottom end of the opposing wall part.

Also, in the semiconductor module described in the above embodiment, the case has an opposing wall part that faces one side of the external terminal, and a fillet is formed on an inner surface of the opposing wall part.

Also, in the semiconductor module described in the above embodiment, a recess for housing a nut is formed on the top face of the case in a location facing the bent external terminal, and a through-hole is formed in the external terminal in a location facing the recess.

INDUSTRIAL APPLICABILITY

As described above, the present invention has an effect of making it possible to prevent damage to the case while also ensuring the bend angle of the external terminal, and is particularly useful in a semiconductor module.

This application is based on Japanese Patent Application No. 2020-103814 filed on Jun. 16, 2020, the content of which is hereby incorporated in entirety.

The invention claimed is:

1. A semiconductor module, comprising:
a semiconductor element;
a case that houses the semiconductor element; and
an external terminal that electrically connects a main electrode of the semiconductor element to an external conductor, wherein
the external terminal includes an intermediate portion that projects out in a first direction from a top surface of the case, and an end portion that is bent along the top surface of the case in a second direction that is orthogonal to the first direction, such that the intermediate portion and the end portion form a right angle, and
the case includes
a protruding part having first and second surfaces facing each other, the protruding part projecting from the top surface of the case in the first direction to a predetermined height above the top surface, and being disposed adjacent to a position where the right angle is formed by the intermediate portion and the end portion, such that the protruding part acts as a fulcrum for bending the external terminal, and
a slit penetrating through the protruding part from the first surface to the second surface in the second direction, the slit starting from a top surface of the protruding part and extending toward a bottom of the case in the first direction, to divide the protruding part along a third direction orthogonal to both the first direction and the second direction, and
the protruding part includes a first protruding part and a second protruding part that are divided by the slit, the first protruding part, the slit, and the second protruding part being entirely covered with the external terminal, the external terminal being a single terminal.

2. The semiconductor module according to claim 1, wherein
the case has an opposing wall part that faces one side of the external terminal,
the protruding part is formed along a top end of the opposing wall part, and
the slit extends up and down in the first direction of the protruding part, and a bottom end of the slit is formed all the way to the opposing wall part.

3. The semiconductor module according to claim 2, wherein the bottom end of the slit is formed all the way to a bottom end of the opposing wall part.

4. The semiconductor module according to claim 2, wherein the bottom end of the slit is formed partway through the opposing wall part, and has an arc shape.

5. The semiconductor module according to claim 2, wherein the case has a recess in the second direction with respect to the opposing wall part, for housing a nut, and
the slit penetrates the recess in the second direction with respect to the opposing wall part.

6. The semiconductor module according to claim 1, wherein the slit is provided in plurality, and the plurality of slits are arranged in the third direction intersecting the first direction of the protruding part.

7. The semiconductor module according to claim 1, wherein a bottom end of the slit diverges into a plurality of paths.

8. The semiconductor module according to claim 1, wherein
the case further includes a through-hole into which the external terminal is insertable,
the through-hole has a rectangular shape in a plan view and has a width and a depth respectively larger than a width and thickness of a cross section of the external terminal, and
the external terminal is inserted into the through-hole from inside the case and projects out from the top surface of the case.

9. The semiconductor module according to claim 1, wherein the case further includes a reinforcement at a position corresponding to a bottom end of the slit.

10. The semiconductor module according to claim 9, wherein
the case has an opposing wall part having an inner surface and a back surface that are opposite to each other, the inner surface facing one side of the external terminal, and
the reinforcement is formed by a thick part thickened on a back surface side of the opposing wall part.

11. The semiconductor module according to claim 1, wherein
the case has an opposing wall part that faces one side of the external terminal,
the slit in the protruding part is a first slit, and
the opposing wall part has a second slit disposed at a bottom end of the opposing wall part.

12. The semiconductor module according to claim 1, wherein
the case has an opposing wall part having an inner surface and a back surface that are opposite to each other, the inner surface facing one side of the external terminal, and
the inner surface of the opposing wall part has a fillet.

13. The semiconductor module according to claim 1, wherein
the case has a recess in the top surface of the case at a position facing the external terminal, for housing a nut, and
the external terminal has a through-hole at a position facing the recess.

14. A semiconductor module, comprising:
a semiconductor element;
a case that houses the semiconductor element; and
an external terminal that electrically connects a main electrode of the semiconductor element to an external conductor, wherein
the external terminal projects out from a top surface of the case and is bent at a right angle along the top surface of the case,
the case includes a protruding part that projects from the top surface of the case in a first direction to a predetermined height above the top surface, and acts as a fulcrum for bending the external terminal, the protruding part having a slit that extends in a second direction intersecting the first direction to divide the protruding part, the case has an opposing wall part that faces one side of the external terminal, the protruding part is formed along a top end of the opposing wall part, the slit extends up and down in the first direction of the protruding part, and a bottom end of the slit is formed all the way to the opposing wall part, and a bottom part of the slit in the second direction with respect to the opposing wall part has an arc shape.

15. A semiconductor module, comprising:

a semiconductor element;

a case that houses the semiconductor element; and an external terminal that electrically connects a main electrode of the semiconductor element to an external conductor, wherein the external terminal includes an intermediate portion that extends and projects outward in a first direction from a top surface of the case, and an end portion that is bent along the top surface of the case, such that the intermediate portion extends in the first direction and the end portion extends in a second direction orthogonal to the first direction and parallel to the top surface of the case, whereby the intermediate portion and the end portion form a right angle when viewed from a third direction orthogonal to both the first direction and the second direction, and the case includes a protruding part having first and second surfaces facing each other in the second direction, the protruding part projecting from the top surface of the case in the first direction to a predetermined height above the top surface, and being disposed adjacent to a position where the right angle is formed by the intermediate portion and the end portion, such that the protruding part acts as a fulcrum for bending the external terminal, and a slit penetrating through the protruding part from the first surface to the second surface in the second direction, the slit starting from a top surface of the protruding part and extending toward a bottom of the case in the first direction, to divide the protruding part along the third direction, and the protruding part includes a first protruding part and a second protruding part that are divided by the slit, the first protruding part, the slit, and the second protruding part being aligned in the third direction and covered with the end portion of the external terminal.

* * * * *